United States Patent
Peng

(10) Patent No.: US 6,888,386 B2
(45) Date of Patent: May 3, 2005

(54) METHOD AND APPARATUS FOR CHANGE PUMP CIRCUIT

(75) Inventor: Yung-Chow Peng, Hsinchu (TW)

(73) Assignee: Winbond Electronics Corporation, Hsinchu (TW)

( * ) Notice: Subject to any disclaimer, the term of this patent is extended or adjusted under 35 U.S.C. 154(b) by 0 days.

(21) Appl. No.: 10/127,732

(22) Filed: Apr. 23, 2002

(65) Prior Publication Data

US 2003/0197535 A1 Oct. 23, 2003

(51) Int. Cl.[7] ............................................... H03L 7/06
(52) U.S. Cl. ...................................... 327/157; 327/148
(58) Field of Search ................................. 327/148, 150, 327/157, 159, 536, 537, 156; 331/17; 375/374

(56) References Cited

U.S. PATENT DOCUMENTS

| | | | | |
|---|---|---|---|---|
| 4,677,323 | A | | 6/1987 | Marsh .......................... 327/416 |
| 5,576,647 | A | | 11/1996 | Sutardja et al. ............. 327/108 |
| 5,767,736 | A | | 6/1998 | Lakshmikumar et al. ... 327/536 |
| 5,801,578 | A | * | 9/1998 | Bereza ......................... 327/536 |
| 5,825,640 | A | * | 10/1998 | Quigley et al. ............... 363/60 |
| 5,886,551 | A | | 3/1999 | Narahara ...................... 327/157 |
| 6,130,565 | A | | 10/2000 | Nagano et al. ............. 327/157 |
| 6,316,977 | B1 | * | 11/2001 | Sargeant ..................... 327/157 |
| 6,483,358 | B2 | * | 11/2002 | Ingino, Jr. .................. 327/157 |

FOREIGN PATENT DOCUMENTS

GB        2360 155 A   * 12/2001   .......... H03L/7/089

OTHER PUBLICATIONS

Paul Horowitz et al., "The Art of Electronics", Second Edition, Cambridge University Press 1980, 1989, pp. 641–655.

Roland E. Best, "Phase–Locked Loops," McGraw–Hill, 1999, pp. 91–176.

* cited by examiner

*Primary Examiner*—Linh M. Nguyen
(74) *Attorney, Agent, or Firm*—Finnegan, Henderson, Farabow, Garrett & Dunner, L.L.P.

(57) ABSTRACT

Charge-pumps consistent with this invention comprise a first transistor for sinking a current from an output node; a second transistor coupled between the first transistor and a ground node, wherein the second transistor interrupts the sinking current when the second transistor is turned off; and a current source to provide a turn-off current to a common node between the first transistor and the second transistor when the second transistor interrupts the sinking current. Charge-pump circuits consistent with this invention comprise a first transistor for sinking a current from an output node; a second transistor coupled between the first transistor and a ground node, wherein the second transistor interrupts the sinking current when the second transistor is turned off; and a clamping circuit to clamp a common node between the first transistor and the second transistor below a clamping voltage.

32 Claims, 6 Drawing Sheets

METHOD AND APPARATUS FOR CHANGE PUMP CIRCUIT

DESCRIPTION OF THE INVENTION

1. Field of the Invention

This invention relates to charge pump circuits, such as charge pump circuits that may be used, for example, in phase-locked loops (PLLs).

2. Background of the Invention

FIG. 1 is a block diagram of a conventional PLL 100. Conventional PLL 100 includes a phase detector 110, a charge pump 120, a loop filter 130, and a voltage controlled oscillator (VCO) 140. Phase detector 110 compares the relative phase of two signals, such as signal $U_1$ and signal $U_2$, and outputs a signal that is a measure of their phase difference. Charge pump 120 outputs positive or negative charge to loop filter 130, based in part on the output of phase detector 110. Typically, charge pump 120 varies the output charge by varying the duration of a current applied to loop filter 130. Based on the output signal of charge pump 120, which is filtered by loop filter 130, VCO 140 deviates the frequency of its output signal $U_2$ toward the frequency of signal $U_1$. The output signal $U_2$ quickly "locks" to the input $U_1$, maintaining a fixed phase relationship between input signal $U_1$ and output signal $U_2$.

FIG. 2 is a circuit diagram of a sinking path circuit 200 of a conventional charge pump 120, that may be used in PLL 100 of FIG. 1, for example. Sinking path circuit 200 includes four metal-oxide-semiconductor (MOS) transistors mn7, mn8, 230, and 240. A reference current $I_{REF}$, is applied to transistor 230 by a current source 250. Reference current $I_{REF}$ is mirrored to transistor mn7. A gate-to-source voltage $V_G$ is applied to transistor 240 so that transistor 230 has a conductive electrical path coupling its source to ground. Transistor 240 may be matched to transistor mn8 so that when a voltage level equal to $V_G$ is applied to a gate 212 of transistor mn8, transistor mn8 couples the source of transistor mn7 to ground. Due to the mirroring effect of transistors 230 and mn7, a current $I_{OUT}$ appears through transistor mn7 that substantially matches current $I_{REF}$. Current $I_{OUT}$ may be provided to loop filter 130 as illustrated in FIG. 1, for example.

Alternatively, instead of applying a voltage equal to $V_G$ to gate 212 of transistor mn8, gate 212 may be grounded, thus removing the substantially conductive path to ground from source 222 of transistor mn7. In this case, substantially no current appears (i.e., $I_{OUT}$ is substantially zero) through transistor mn7. One of ordinary skill in the art recognizes how similar principles are used for the driving path of charge pump 120.

In a variety of applications, it is desirable for charge pump 120 to switch at high speeds. Typically, high speed charge pump circuits require large output currents. Large output currents, however, are not desirable in PLLs because they generate noise that degrades performance. Furthermore, large currents require larger, more costly circuit components. Therefore, there is a need for a charge pump circuit that operates at high switching speeds while reducing charge-pump current.

SUMMARY OF THE INVENTION

Charge-pumps consistent with this invention comprise a first transistor for sinking a current from an output node; a second transistor coupled between the first transistor and a ground node, wherein the second transistor interrupts the sinking current when the second transistor is turned off; and a current source to provide a turn-off current to a common node between the first transistor and the second transistor when the second transistor interrupts the sinking current.

Charge-pump circuits consistent with this invention comprise a first transistor for sinking a current from an output node; a second transistor coupled between the first transistor and a ground node, wherein the second transistor interrupts the sinking current when the second transistor is turned off; and a clamping circuit to clamp a common node between the first transistor and the second transistor below a clamping voltage.

Charge-pumps consistent with this invention comprise a first transistor to drive a current to an output node; a second transistor coupled between the first transistor and a power supply, wherein the second transistor interrupts the driving current when the second transistor is turned off; and a current source to provide a turn-off current to a common node between the first transistor and the second transistor when the second transistor interrupts the driving current.

Charge-pump circuits consistent with this invention comprise a first transistor for driving a current to an output node; a second transistor coupled between the first transistor and a power supply, wherein the second transistor interrupts the driving current when the second transistor is turned off; and a clamping circuit to clamp a common node between the first transistor and the second transistor above a clamping voltage.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DESCRIPTION OF THE EMBODIMENTS

Figure 1:
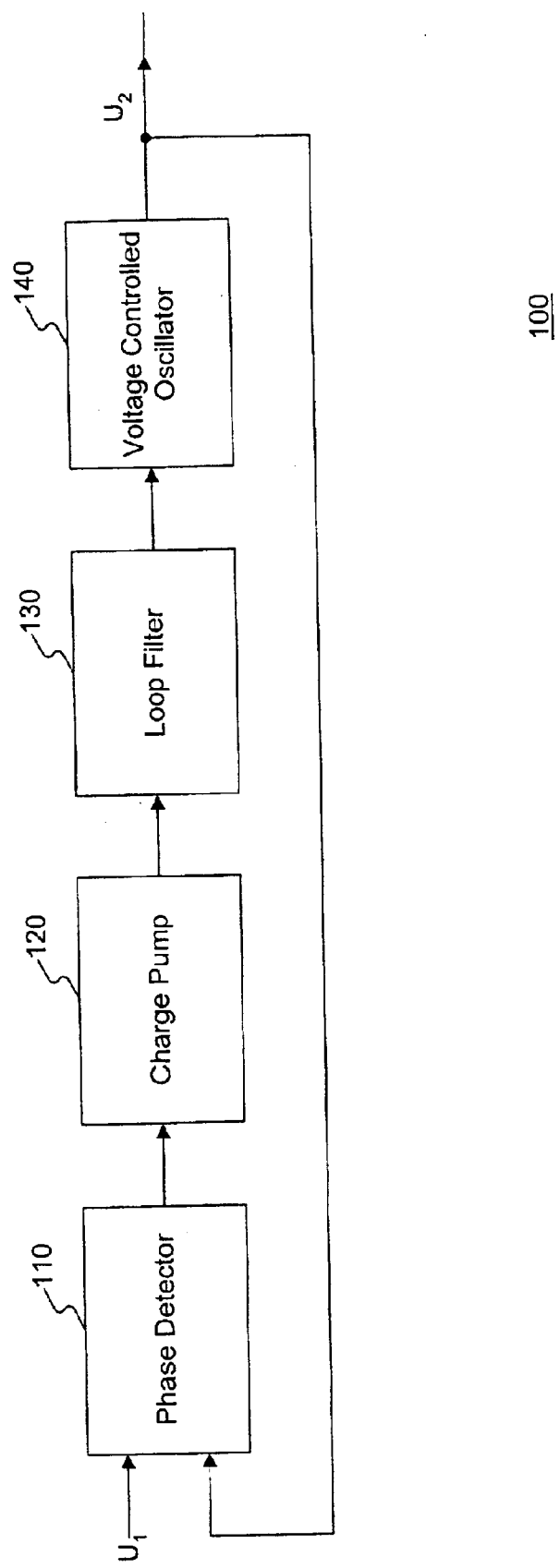
FIG. 1 is a block diagram of a conventional PLL.

Reference is made below in detail to the present exemplary embodiments of the invention, examples of which are illustrated in the accompanying drawings. Wherever possible, the same reference characters or numbers are used throughout the drawings to refer to the same or like parts.

Figure 2:
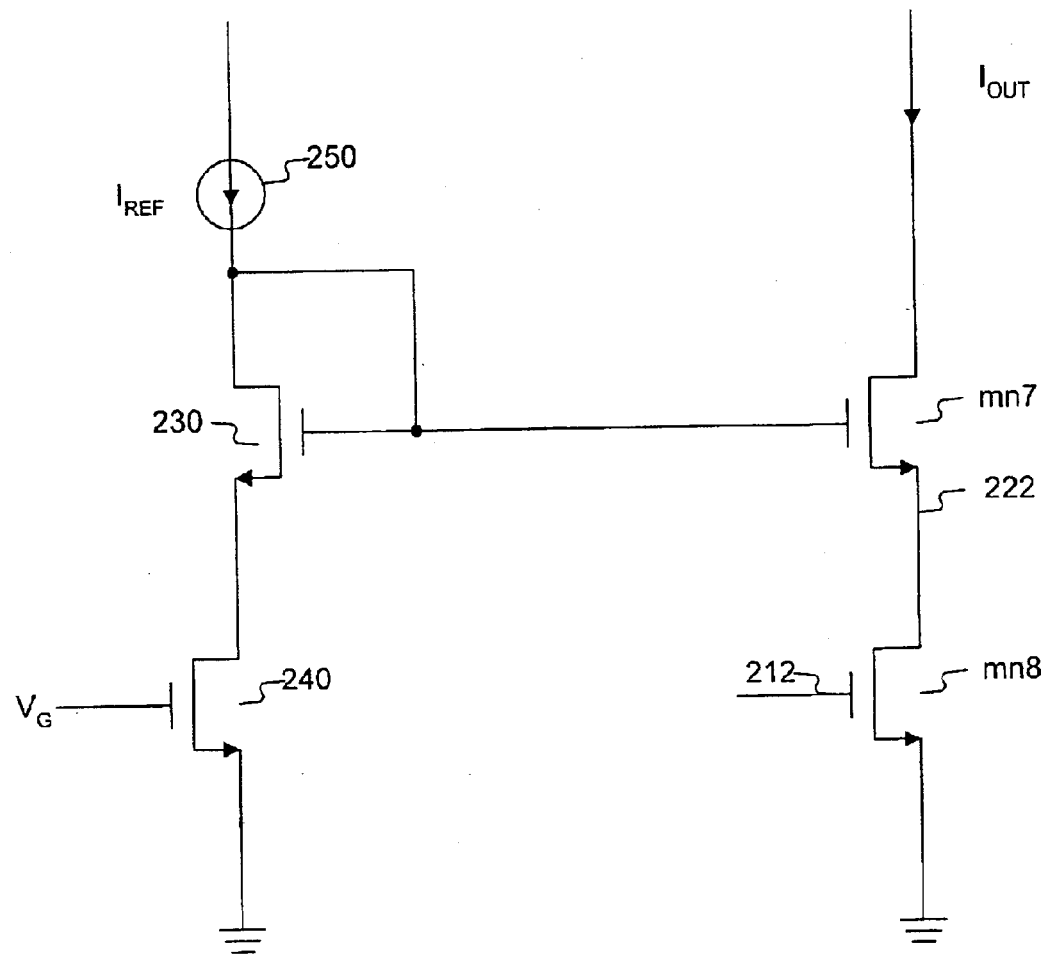
FIG. 2 is a circuit diagram of a sinking path circuit of a conventional charge pump that may be used in the PLL of FIG. 1.
Figure 3:
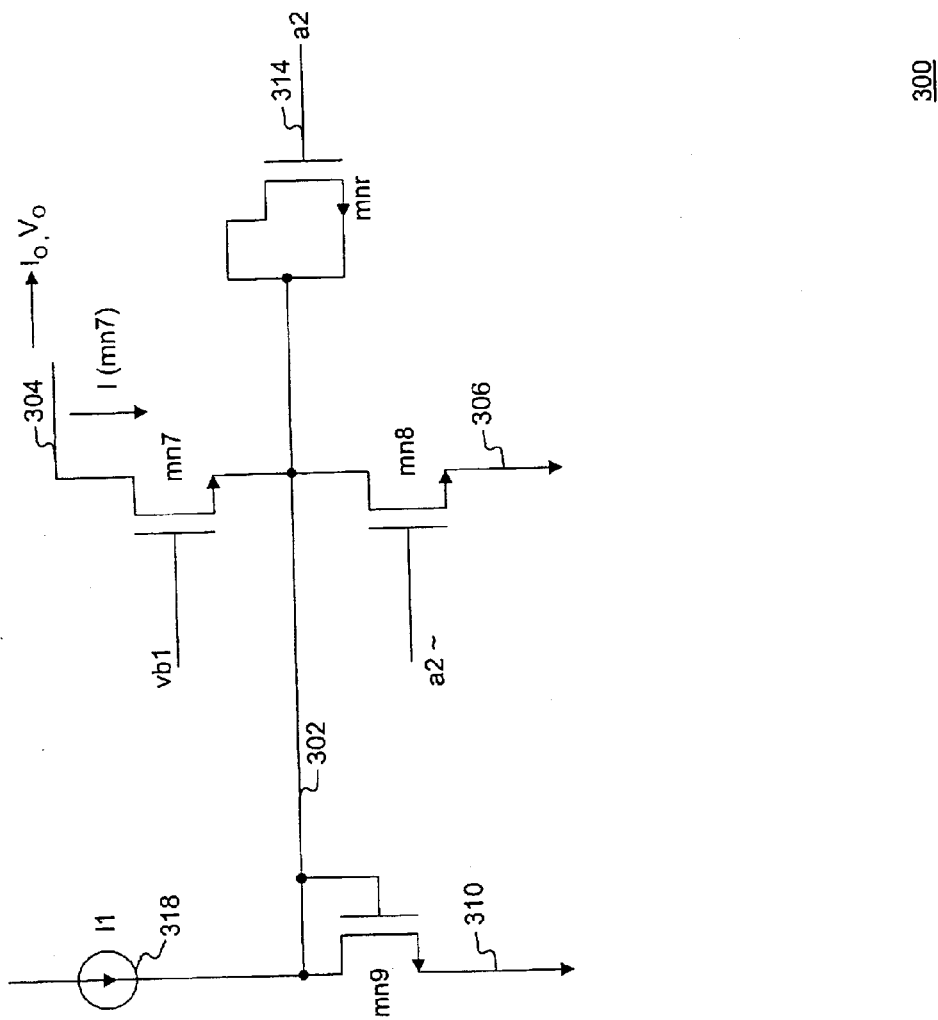
FIG. 3 is a circuit diagram of a sinking path of a charge pump circuit consistent with this invention.

FIG. 3 is a circuit diagram of a sinking path 300 of a charge pump circuit consistent with this invention. The embodiment shown in FIG. 3 comprises four MOS transistors mn7, mn8, mn9, and mnr. Transistor mn7 acts as a current sinking device and comprises a gate connected to a voltage bias signal vb1; a drain that sinks a current I(mn7) from an output node 304; and a source connected to the drain of transistor mn8 at a common node 302. Voltage vb1 is a bias voltage that controls the magnitude of sinking current I(mn7) to output node 304. A current mirror circuit similar to that discussed with respect to charge-pump circuit 200 of FIG. 2 may supply bias voltage vb1.

Transistor mn8 acts as a current control device and comprises a source connected to ground; a drain connected to the source of transistor mn7 at common node 302; and a gate connected to an input signal a2~. When the voltage of signal a2~ is sufficiently high, transistor mn8 turns on and couples the source of transistor mn7 to ground and current I(mn7) passes through transistors mn7 and mn8. Alternatively, when the voltage of signal a2~ is sufficiently low, transistor mn8 turns off and the source of transistor mn7 does not have a substantially conductive path to ground. Thus, when mn8 turns off, transistor mn7 subsequently turns off as well. When transistor mn8 is off, substantially no current passes through transistor mn7 or transistor mn8, i.e., I(mn7) is substantially zero. Current I(mn7) may form part of output current $I_O$.

In the embodiment of FIG. 3, a current source 318 provides current I1 to common node 302. Current source 318 assists turning off transistor mn7 by allowing transistor mn7 to turn off more quickly after transistor mn8 turns off. With current I1, transistor mn7 turns off more quickly because when transistor mn8 turns off, the current through transistor mn7 declines more quickly. Transistor mn7 turns off more quickly because current I1 helps pull up the source node voltage of transistor mn7 when transistor mn8 is turned off until it is clamped by transistor mn9. This may be referred to as "current control pull-off" because current I1 supplies "turn-off" current to turn off transistor mn7. Without current I1, the current through transistor mn7 is not as sufficient to pull up the source node voltage of transistor mn7 to turn off.

In the embodiment of FIG. 3, transistor mn9 acts as a clamping device and comprises a source connected to ground; and a gate and a drain connected to the source of transistor mn7 and the drain of transistor mn8 at common node 302. Transistor mn9 clamps the source voltage of transistor mn7 to below a clamped voltage when transistor mn8 is turned off. The clamped voltage is the voltage drop across transistor mn9. Clamping provides the advantage of reducing switching noise because the voltage change of common node 302 (the source node of transistor mn7) is minimized. In the embodiment of FIG. 3, transistor mn9 turns off when transistor mn8 turns on. Thus, a part of current I1 goes through transistor mn8 when transistor mn8 is turned on. When transistor mn8 turns off (and transistor mn7 turns off), transistor mn9 turns on and a part of current I1 flows through transistor mn9 to ground.

Current source 318 may be implemented as a simple current mirror current source, as is evident to one of ordinary skill in the art. Alternatively, current source 318 may be a resistor or any other well-known device that achieves the same purposes.

Transistor mnr acts as a "dummy device" and comprises a gate with a control signal a2; and a source and a drain connected together and to common node 302. Control signal a2 of transistor mnr is the inverse of control signal a2~ of transistor mn8. Because control signals a2 and a2~ are inverted, channel charge between transistor mn7 and transistor mn8 are complementary, thus reducing switching noise. In other words, transistor mnr may minimize switching noise due to charge rejection from transistor mn7 and transistor mn8.

Below is a truth table of the different states of transistors mn7, mn8, mn9, and mnr.

TABLE I

| transistor | mn7 | mn8 | mn9 | mnr |
|---|---|---|---|---|
| state 1 | on | on | off | off |
| state 2 | off | off | on | on |

Figure 4:
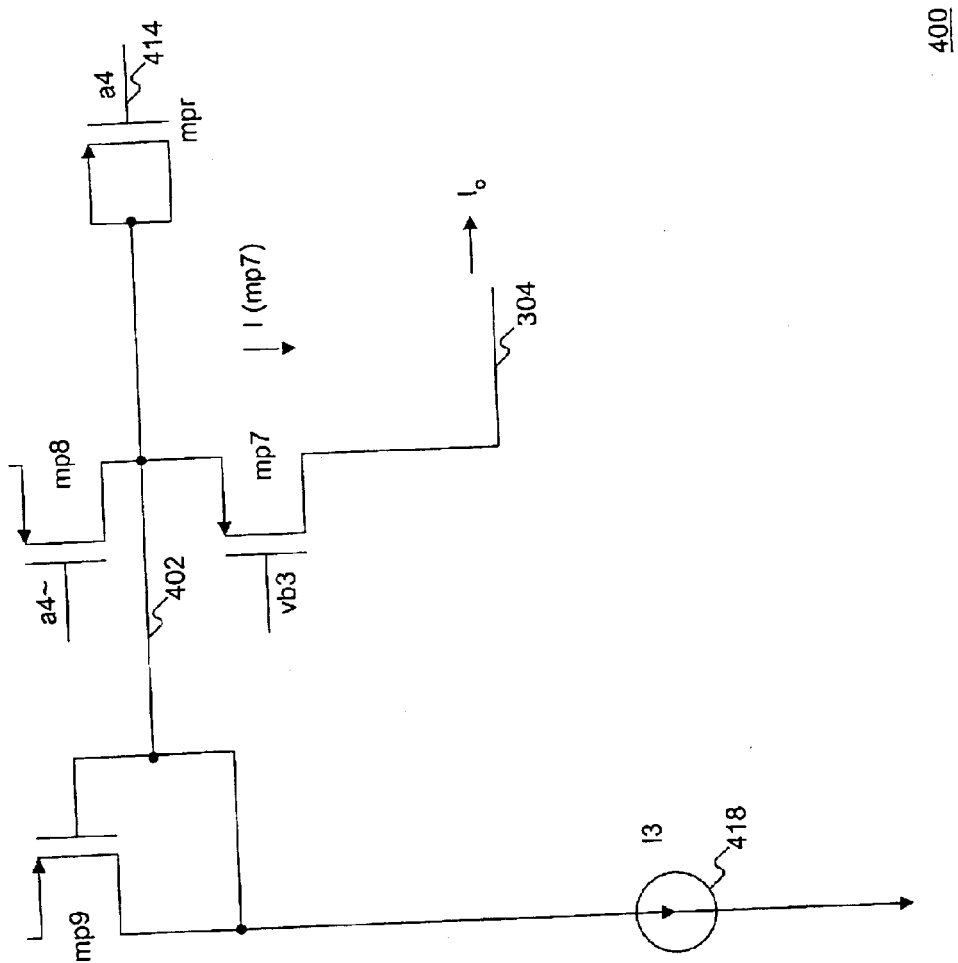
FIG. 4 is a circuit diagram of a driving path of a charge pump circuit consistent with this invention.

FIG. 4 is a circuit diagram of a driving path 400 of a charge pump circuit consistent with this invention. The operation of the embodiment of FIG. 4 is similar to the operation of the embodiment of FIG. 3. The embodiment shown in FIG. 4 comprises four MOS transistors mp7, mp8, mp9, and mpr. Transistor mp7 acts as a current driving device and comprises a gate connected to a voltage bias signal vb3; a drain that drives a current I(mp7) to output node 304; and a source connected to the drain of transistor mp8 at a common node 402. Voltage vb3 is a bias voltage that controls the magnitude of driving current I(mp7) to output node 304. A current mirror circuit similar to that discussed with respect to charge-pump circuit 200 of FIG. 2 may supply bias voltage vb3.

Transistor mp8 acts as a current control device and comprises a source connected to voltage supply $V_{DD}$; a drain connected to the source of transistor mp7 at common node 402; and a gate connected to an input signal a4~. When the voltage of signal a4~ is sufficiently low, transistor mp8 turns on and couples the source of transistor mp7 to voltage supply $V_{DD}$ and current I(mp7) passes through transistors mp7 and mp8 to output node 304. Alternatively, when the voltage of signal a4~ is high, i.e., approximately $V_{DD}$, transistor mp8 turns off and the source of transistor mp7 does not have a substantially conductive path to voltage supply $V_{DD}$. Thus, when mp8 turns off, transistor mp7 subsequently turns off as well. When transistor mp8 is off, substantially no current passes through transistor mn7 or transistor mn8, i.e., I(mp7) is substantially zero. Current I(mp7) may form part of output current $I_O$.

In the embodiment of FIG. 4, a current source 418 provides current I3 to common node 402. Current source 418 assists turning off transistor mp7 by allowing transistor mp7 to turn off more quickly after transistor mp8 turns off. With current I3, transistor mp7 turns off more quickly because when transistor mn8 turns off, the current through transistor mp7 declines more quickly. Transistor mp7 turns off more quickly because current I3 helps pull down the source node voltage of transistor mp7 when transistor mp8 is turned off until it is clamped by transistor mn9. This may be referred to as "current control pull-off" because current I3 supplies "turn-off" current to turn off transistor mp7. Without current I3, the current through transistor mp7 is less sufficient (i.e., has less charge) to pull down the source node voltage of transistor mp7 to turn off.

In the embodiment of FIG. 4, transistor mp9 acts as a clamping device and comprises a source connected to voltage supply $V_{DD}$; and a gate and a drain connected to the source of transistor mp7 and the drain of transistor mp8 at common node 402. Transistor mp9 clamps the source voltage of transistor mp7 to above a voltage when transistor mp8 is turned off. The clamped voltage is $V_{DD}$ minus the voltage drop across transistor mp9. Clamping provides the advantage of reducing switching noise because the voltage change of common node 402 (the source node of transistor mp7) is minimized. In the embodiment of FIG. 4, transistor mp9 turns off when transistor mp8 turns on. Thus, a part of current I3 goes through transistor mp8 when transistor mp8 is turned on. When transistor mp8 turns off (and transistor mp7 turns off), transistor mp9 turns on and a part of current I3 flows through transistor mp9 to ground.

Current source 418 may be implemented as a simple current mirror current source, as evident to one of ordinary skill in the art. Alternatively, current source 418 may be a resistor or any other well-known device that achieves the same purposes.

Transistor mpr acts as a "dummy device" and comprises a gate with a control signal a4; and a source and a drain connected together and to common node 402. Control signal a4 of transistor mpr is the inverse of control signal a4~ of transistor mp8. Because control signals a4 and a4~ are inverted, channel charge between transistor mp7 and transistor mp8 are complementary, thus reducing switching noise. Thus, transistor mpr minimizes switching noise due to charge rejection from transistor mp7 and transistor mp8.

Below is a truth table of the different states of transistors mp7, mp8, mp9, and mpr.

TABLE II

| transistor | mp7 | mp8 | mp9 | mpr |
|---|---|---|---|---|
| state 1 | on | on | off | off |
| state 2 | off | off | on | on |

Figure 5:
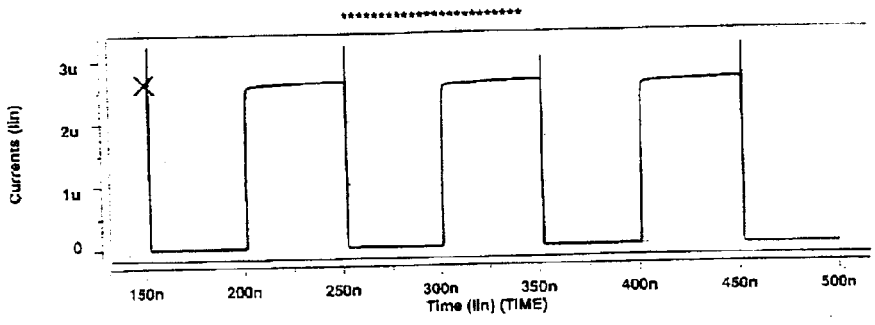
FIG. 5 is a signal diagram of current through transistor mn7 of FIG. 3 from a SPICE simulation.
Figure 6:
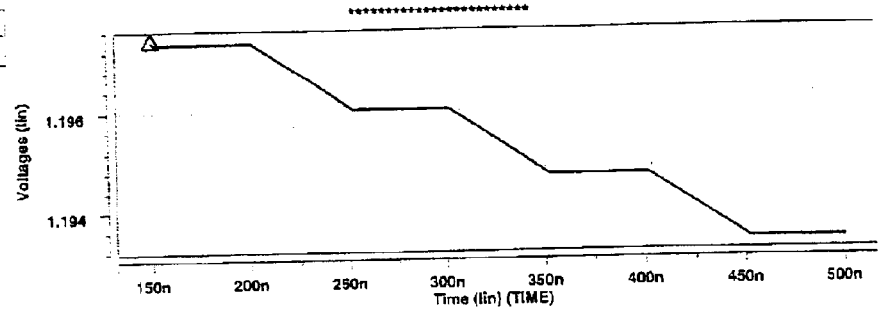
FIG. 6 is a signal diagram of an output voltage $V_O$ in FIG. 3 from a SPICE simulation.

FIGS. 5, 6, 7, and 8 are signal diagrams of a SPICE simulation of a low voltage, 200 MHz sinking path charge pump circuit shown in FIG. 3. In the simulation, $V_{DD}$ is 2.5 volts. FIG. 5 is a signal diagram of current I(mn7) through transistor mn7 of FIG. 3 from a SPICE simulation. The vertical axis of FIG. 5 represents the current in microamps, and the horizontal axis represents time in nanoseconds. As shown in FIG. 5, there is little spiking current when transistor mn7 turns on after being off, resulting in greater accuracy and higher switching speeds for sinking current control. FIG. 6 is a signal diagram of an output voltage $V_O$ in FIG. 3 from a SPICE simulation. The vertical axis of FIG. 6 represents voltage in volts, and the horizontal axis represents time in nanoseconds.

Figure 7:
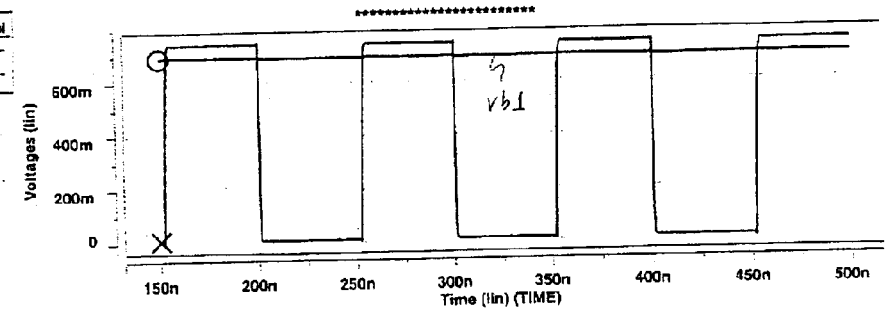
FIG. 7 is a signal diagram of voltage bias signal vb1 and a voltage at a common node from a SPICE simulation.
Figure 8:
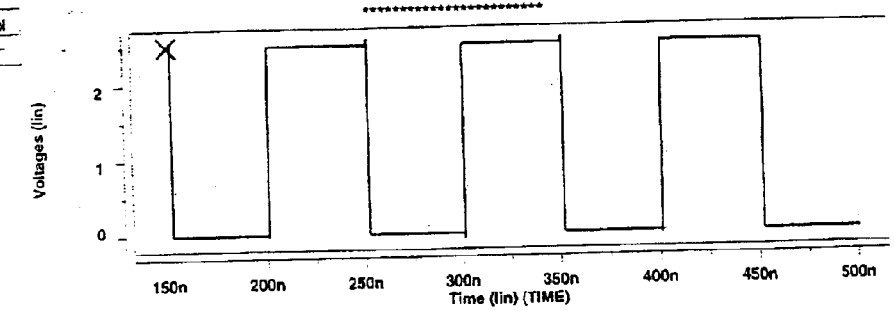
FIG. 8 is a signal diagram of control signal a2~ at a gate voltage of transistor mn8 from a SPICE simulation.

FIG. 7 is a signal diagram of voltage bias signal vb1 and a voltage v(com) at common node 302 from a SPICE simulation. The value of voltage bias signal vb1 is constant at approximately 700 mV. FIG. 8 is a signal diagram of control signal a2~ at the gate voltage of transistor mn8 from a SPICE simulation. Control signal a2~ is periodic with a period of 100 nanoseconds as shown in FIG. 8. The value of a voltage v(com) at common node 302 shown in FIG. 7 is periodic and may follow the control signal a2~ of FIG. 8 very closely.

Figure 9:
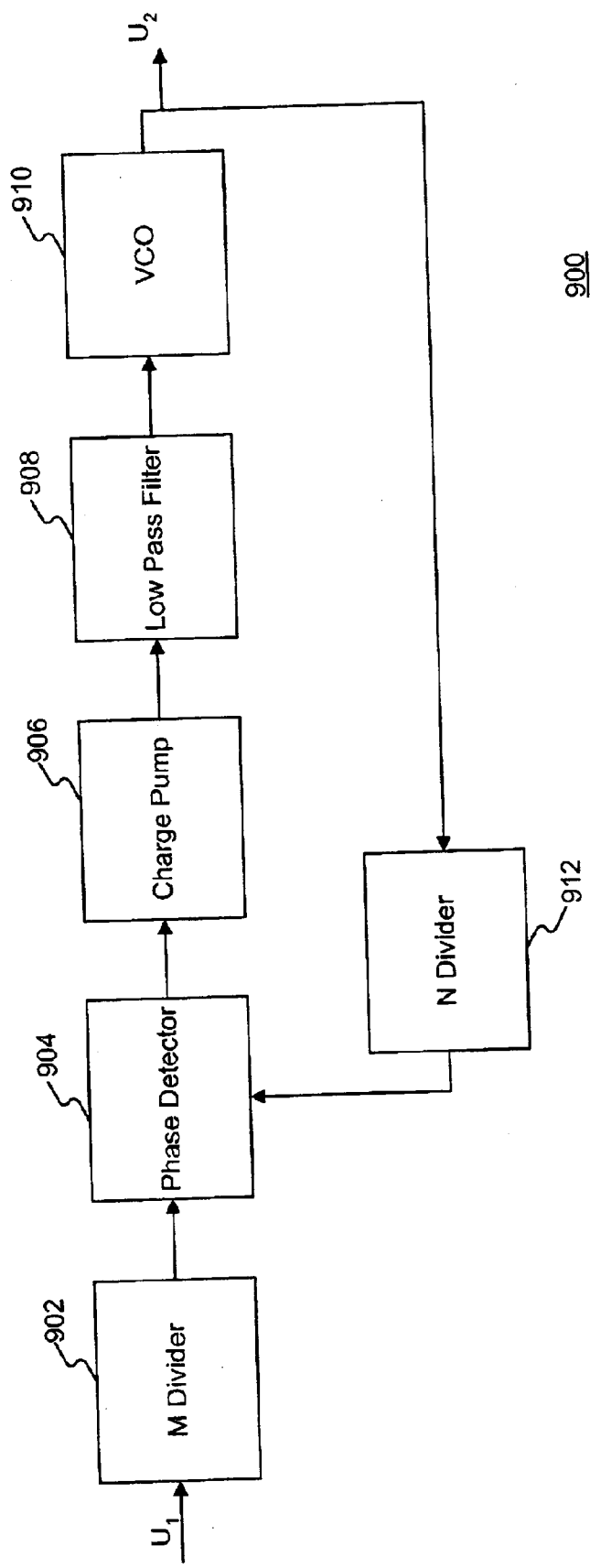
FIG. 9 is a block diagram of a PLL using a charge pump circuit consistent with this invention.

FIG. 9 is a block diagram of a PLL 900 using a charge pump 906 consistent with this invention. Charge pump 906 may comprise sinking path 300 and driving path 400 as shown in FIGS. 3 and 4. PLL 900 consists of an M divider 902, a phase detector 904, a charge pump 906, a low pass filter 908, a voltage controlled oscillator 910, and an N divider 912. M divider 902 divides input signal $U_1$ frequency by the factor M. N divider divides output signal $U_2$ frequency by N.

Other embodiments of the invention are apparent to those skilled in the art from consideration of the specification and practice of the invention disclosed herein. For example, one of ordinary skill in the art realizes that methods and systems consistent with this invention may be used in a delay-locked loop (DLL) as well as a PLL. Further, clamping device mn9 may be replaced by a diode or a series of diodes. Still further, bipolar junction transistors (BJTs) may be used instead of MOS transistors. It is intended that the specification and examples be considered as exemplary only, with a true scope and spirit of the invention being indicated by the following claims.

What is claimed is:

1. A charge-pump circuit comprising:
   a first transistor for sinking a current from an output node;
   a second transistor coupled in series with the first transistor and a power node, wherein the second transistor interrupts the sinking current when the second transistor is turned off;
   a continuous current source to provide a turn-off current to a common node between the first transistor and the second transistor when the second transistor interrupts the sinking current; and
   a clamping circuit to clamp the common node below a clamping voltage, wherein the clamping circuit comprises a metal-oxide-semiconductor (MOS) transistor with a source coupled to ground, a drain coupled to the common node, and a gate coupled to the common node.

2. The charge-pump circuit of claim 1, wherein the first transistor is a metal-oxide-semiconductor (MOS) transistor and the turn-off current is provided to a source node of the first transistor.

3. The charge-pump circuit of claim 1, wherein the first transistor is a metal-oxide-semiconductor (MOS) transistor and the turn-off current is provided to a source node of the first transistor.

4. A charge-pump circuit comprising:
   a first transistor for sinking a current from an output node;
   a second transistor coupled in series with the first transistor and a power node, wherein the second transistor interrupts the sinking current when the second transistor is turned off; and
   a clamping circuit to clamp a common node between the first transistor and the second transistor below a clamping voltage when the second transistor interrupts the sinking current, wherein the clamping circuit comprises a metal-oxide-semiconductor (MOS) transistor with a source coupled to ground, a drain coupled to the common node, and a gate coupled to the common node.

5. A method for operating a charge-pump circuit, wherein the charge-pump circuit comprises a first transistor for sinking a current from an output node and a second transistor coupled in series with the first transistor and a power node, wherein the second transistor interrupts the sinking current when the second transistor is turned off, wherein the method comprises:
   providing a continuous turn-off current to a common node between the first transistor and the second transistor for when the second transistor interrupts the sinking current; and clamping the common node below a clamping voltage, wherein clamping uses a metal-oxide-semiconductor (MOS) transistor with a source coupled to ground, a drain coupled to the common node, and a gate coupled to the common node.

6. The method of claim 5, wherein the first transistor is a metal-oxide-semiconductor (MOS) transistor and the turn-off current is provided to a source node of the first transistor.

7. The method of claim 5, wherein the first transistor is a metal-oxide-semiconductor CMOS) transistor and the turn-off current is provided to a source node of the first transistor.

8. A method for operating a charge-pump circuit having a first transistor for sinking a current from an output node and a second transistor coupled in series with the first transistor and a power node, wherein the second transistor interrupts the sinking current when the second transistor is turned off, wherein the method comprises:

clamping a common node between the first transistor and the second transistor below a clamping voltage when the second transistor interrupts the sinking current, wherein clamping uses a metal-oxide-semiconductor (MOS) transistor with a source coupled to ground, a drain coupled to the common node, and a gate coupled to the common node.

9. A charge-pump circuit comprising:

a first transistor to drive a current to an output node;

a second transistor coupled in series with the first transistor and a power supply, wherein the second transistor interrupts the driving current when the second transistor is turned off;

a continuous current source to provide a turn-off current to a common node between the first transistor and the second transistor when the second transistor interrupts the driving current; and a clamping circuit to clamp the common node above a clamping voltage, wherein the clamping circuit comprises a metal-oxide-semiconductor (MOS) transistor with a source coupled to ground, a drain coupled to the common node, and a gate coupled to the common node.

10. The charge-pump circuit of claim 9, wherein the first transistor is a metal-oxide-semiconductor (MOS) transistor and the turn-off current is provided to a source of the MOS transistor.

11. The charge-pump circuit of claim 9, wherein the first transistor is a metal-oxide-semiconductor (MOS) transistor and the turn-off current is provided to a source of the MOS transistor.

12. A charge-pump circuit comprising:

a first transistor for driving a current to an output node;

a second transistor coupled in series with the first transistor and a power supply, wherein the second transistor interrupts the driving current when the second transistor is turned off; and a clamping circuit to clamp a common node between the first transistor and the second transistor a clamping voltage when the second transistor interrupts the driving current, wherein the clamping circuit comprises a metal-oxide-semiconductor (MOS) transistor with a source coupled to ground, a drain coupled to the common node, and a gate coupled to the common node.

13. A method for operating a charge-pump circuit, wherein the charge-pump circuit comprises a first transistor for driving a current from an output node and a second transistor coupled in series with the first transistor and a power node, wherein the second transistor interrupts the driving current when the second transistor is turned off, wherein the method comprises:

providing a continuous turn-off current to a common node between the first transistor and the second transistor when the second transistor interrupts the driving current; and clamping the common node to above a clamping voltage, wherein clamping uses a metal-oxide-semiconductor (MOS) transistor with a source coupled to ground, a drain coupled to the common node, and a gate coupled to the common node.

14. The method of claim 13, wherein the first transistor is a metal-oxide-semiconductor (MOS) transistor and the turn-off current is provided to a source node of the first transistor.

15. The method of claim 13, wherein the first transistor is a metal-oxide-semiconductor (MOS) transistor and the turn-off current is provided to a source node of the first transistor.

16. A method for operating a charge-pump circuit having a first transistor for driving a current from an output node and a second transistor coupled in series with the first transistor and a power node, wherein the second transistor interrupts the driving current when the second transistor is turned off, wherein the method comprises:

clamping a common node between the first transistor and the second transistor above a clamping voltage when the second transistor interrupts the driving current, wherein clamping uses a metal-oxide-semiconductor (MOS) transistor with a source coupled to ground, a drain coupled to the common node, and a gate coupled to the common node.

17. An apparatus for operating a charge-pump circuit, wherein the charge-pump circuit comprises a first transistor for sinking a current from an output node and a second transistor coupled in series with the first transistor and a power node, wherein the second transistor interrupts the sinking current when the second transistor is turned off, wherein the apparatus comprises:

means for providing a continuous turn-off current to a common node between the first transistor and the second transistor when the second transistor interrupts the sinking current; and means for clamping the common node below a clamping voltage, wherein the means for clamping uses a metal-oxide-semiconductor (MOS) transistor with a source coupled to ground, a drain coupled to the common node, and a gate coupled to the common node.

18. The apparatus of claim 17, wherein the first transistor is a metal-oxide-semiconductor (MOS) transistor and the turn-off current is provided to a source node of the first transistor.

19. The apparatus of claim 17, wherein the first transistor is a metal-oxide-semiconductor (MOS) transistor and the turn-off current is provided to a source node of the first transistor.

20. An apparatus for operating a charge-pump circuit having a first transistor for sinking a current from an output node and a second transistor coupled in series with the first transistor and a power node, wherein the second transistor interrupts the sinking current when the second transistor is turned off, wherein the apparatus comprises:

means for clamping a common node between the first transistor and the second transistor below a clamping voltage when the second transistor interrupts the sinking current, wherein the means for clamping uses a metal-oxide-semiconductor (MOS) transistor with a source coupled to ground, a drain coupled to the common node, and a gate coupled to the common node.

21. A phase-locked loop having a phase detector, a low pass filter, a voltage controlled oscillator, and a charge-pump circuit, wherein the charge pump circuit comprises:

a first transistor for sinking a current from an output node;

a second transistor coupled in series with the first transistor and a power node, wherein the second transistor interrupts the sinking current when the second transistor is turned off;

a continuous current source to provide a turn-off current to a common node between the first transistor and the second transistor when the second transistor interrupts the sinking current; and a clamping circuit to clamp the common node below a clamping voltage, wherein the clamping circuit comprises a metal-oxide-semiconductor (MOS) transistor with a source coupled to ground, a drain coupled to the common node, and a gate coupled to the common node.

22. The phase-locked loop of claim 21, wherein the first transistor is a metal-oxide-semiconductor (MOS) transistor and the turn-off current is provided to a source node of the first transistor.

23. The phase-locked loop of claim 21, wherein the first transistor is a metal-oxide-semiconductor (MOS) transistor and the turn-off current is provided to a source node of the first transistor.

24. The phase-locked loop of claim 23, further including a divider circuit.

25. A phase-locked loop having a phase detector, a low pass filter, a voltage controlled oscillator, and a charge-pump circuit, wherein the charge pump circuit comprises:

a first transistor for sinking a current from an output node;

a second transistor coupled in series with the first transistor and a power node, wherein the second transistor interrupts the sinking current when the second transistor is turned off; and a clamping circuit to clamp a common node in series with the first transistor and the second transistor below a clamping voltage when the second transistor interrupts the sinking current, wherein the clamping circuit comprises a metal-oxide-semiconductor (MOS) transistor with a source coupled to ground, a drain coupled to the common node, and a gate coupled to the common node.

26. The phase-locked loop of claim 25, further including a divider circuit.

27. The charge-pump circuit of claim 1, wherein the continuous current source provides a constant turn-off current.

28. The method of claim 5, wherein the continuous turn-off current is constant.

29. The charge-pump circuit of claim 9, wherein the continuous current source provides a constant turn-off current.

30. The method of claim 13, wherein the continuous turn-off current is constant.

31. The apparatus of claim 17, wherein the continuous turn-off current is constant.

32. The phase-locked loop of claim 21, wherein the continuous current source provides a constant turn-off current.

* * * * *